United States Patent [19]

Utsugi et al.

[11] Patent Number: 5,670,792
[45] Date of Patent: Sep. 23, 1997

[54] CURRENT-CONTROLLED LUMINOUS ELEMENT ARRAY AND METHOD FOR PRODUCING THE SAME

[75] Inventors: Koji Utsugi; Naoyasu Ikeda, both of Tokyo, Japan

[73] Assignee: NEC Corporation, Tokyo, Japan

[21] Appl. No.: 321,608

[22] Filed: Oct. 12, 1994

[30] Foreign Application Priority Data

Oct. 12, 1993 [JP] Japan ................................. 5-253866

[51] Int. Cl.$^6$ ......................................................... G09G 3/30
[52] U.S. Cl. ........................... 257/59; 257/40; 313/504; 313/505; 340/825.81; 345/76; 345/80; 345/206
[58] Field of Search ............................. 257/40, 59, 72; 313/504, 505; 345/206, 76, 91, 58, 80; 340/825.81

[56] References Cited

U.S. PATENT DOCUMENTS

| | | | |
|---|---|---|---|
| 2,965,802 | 12/1960 | Loebner | 345/81 |
| 3,621,321 | 11/1971 | Williams | 313/504 |
| 4,114,070 | 9/1978 | Asars | 315/169.2 |
| 5,105,233 | 4/1992 | Egusa | 257/40 |
| 5,220,316 | 6/1993 | Kazan | 340/784 |
| 5,294,811 | 3/1994 | Aoyama et al. | 257/59 |
| 5,343,050 | 8/1994 | Egusa et al. | 257/40 |
| 5,408,109 | 4/1995 | Heeger et al. | 257/40 |
| 5,514,878 | 5/1996 | Holmes et al. | 257/40 |

FOREIGN PATENT DOCUMENTS

| | | |
|---|---|---|
| 2488016 | 7/1980 | France . |
| 2-196475 | 8/1990 | Japan ........................... 257/40 |
| 4-297076 | 10/1992 | Japan ........................... 257/40 |
| 0553950A2 | 8/1993 | Japan . |

OTHER PUBLICATIONS

Howard, W.E., "Active-Matrix Techniques for Displays," Proceedings for the Society for Information Display (SID) vol. 27, No. 4, 1986, pp. 313–326

Japan Display '89, pp. 704–707, entitled "Matrix-Addressed Organic Thin film EL Display Panel".

EuroDisplay '90, pp. 216–219, entitled "Design of a Prototype Active Matrix CdSe TFT Adressed EL Display".

European Search Report.

*Primary Examiner*—Jerome Jackson
*Assistant Examiner*—John Guay
*Attorney, Agent, or Firm*—Whitham, Curtis, Whitham & McGinn

[57] ABSTRACT

In a current-controlled luminous element array, combinations of a luminous element of a current-controlled type, a current-controlling transistor for controlling the current of the luminous element, and a switching transistor are arranged in a matrix form between signal electrode lines and scan electrode lines such that the luminous element is connected at one terminal thereof to a power source electrode line and at the other terminal thereof to a drain electrode of the current-controlling transistor, a gate electrode of the current-controlling transistor and one signal electrode line have the switching transistor connected therebetween, and the current-controlling transistor in an arbitrary column of matrix has a source electrode thereof connected to one scan electrode line in another column.

14 Claims, 6 Drawing Sheets

CURRENT-CONTROLLED LUMINOUS ELEMENT ARRAY AND METHOD FOR PRODUCING THE SAME

BACKGROUND OF THE INVENTION

The present invention relates to a current-controlled luminous element array and a method for producing the same, and in particular to a current-controlled luminous element array of an active matrix type such as for a display purpose, having multiple current-controlled luminous elements arranged in a matrix form, and a method for producing the same.

DESCRIPTION OF THE RELATED ARTS

As conventional current-controlled luminous elements there are well known EL(electroluminescent) elements, LED(light emitting diode)'s, etc. In particular, the organic EL element of a charge injection type employing a thin-filmed organic luminescent material as an illuminant, hereinafter called "organic thin-film EL element", is attracting attentions for the possibility of realizing an inexpensive full-colored wide display that would be difficult by using an inorganic thin-film EL element or an LED. There will be described the constitution of a conventional typical current-controlled luminous element array in an EL panel using an organic thin-film EL element.

The organic thin-film EL element is a current-controlled luminescent element of the type that is constituted with an organic luminescent layer consisting of an organic coloring matter strong of luminescence and a charge injection layer, the layers being formed between a pair of electrodes either or both transparent (or translucent), and that gives an effective luminescence due to the recombination between injected electrons and positive holes from the electrodes. An essential feature of the organic thin-film EL element resides in that, with a lower voltage than a level near 10 V, a higher luminance than a level near 1000 cd/m$^2$ is easily obtainable in addition to that a high luminous efficiency is achieved in a range over several lumens per watt (subject to a direct-current driving). Such the luminous performance stands beyond those of inorganic thin-film EL elements.

An example of utilization of the high luminous performance is reported in the JAPAN DISPLAY '89 published by the Society for Information Display, at pages 704 to 707, in which an organic thin-film EL element is applied to a dot matrix display.

FIG. 1 is a perspective sectional view of a display-oriented organic thin-film EL panel in the example reported in the above JAPAN DISPLAY '89, a collection book of prepared papers. According to the collection book, the shown EL panel has, on a glass base 150, a plurality of signal lines 151 extending parallel to one another, an organic thin-film layer 152 as an illuminant layer, and a plurality of scan lines 153 crossing over the signal lines 151, formed in this order. The organic thin-film layer 152 has a dual layer structure consisting of a hole injection layer 152A formed over the signal lines 151, and an organic emission layer 152B laminated on the hole injection layer 152A. The signal lines 151 are made of a transparent electrode material ITO (indium tin oxide), so that the generated light in the organic thin-film layer 152 can be emitted through the transparent signal lines 151 outside the glass base 150. The panel driving of the display in concern is performed in a so-called simple matrix line sequencing manner. That is, the scan lines 153 employed as common lines are sequentially selected one by one, and each selected scan line continuously applies a positive drive pulse voltage $V_D$ to all signal lines 151 during the selected period of time. A pulse driving with a drive pulse voltage within a range of 20 V to 30 V and at a duty of 3.5% gives a luminance within a range of 20 cd/m$^2$ to 30 cd/m$^2$. The luminescence response speed to on-off actions of the drive pulse is lower than 10 μs. In such pulse driven cases, the luminance is proportional to the drive pulse duration.

The simple matrix type EL panel using the organic thin-film EL element in concern also shows a characteristic that the luminance increases in proportion to the drive pulse duration, as described. Therefore, an increased number of scan lines requiring a drive pulse higher of duty and smaller of duration would cause a problematic insufficiency of luminance per pulse. A limitation is thus given to the increase in number of scan lines. The reduction of luminance due to a high raised duty might be compensated by using a high raised drive pulse voltage, which however interferes with a sufficient utilization of the voltage stabilizing advantage the organic thin-film EL element otherwise would permit. Still worse, the use of a voltage high-raised drive pulse may aggravate the aging of organic thin-film EL element, causing the charge injection efficency and the luminous efficiency to be both lowered with time, thus failing to keep a stable luminance that would be achieved under a stable drive voltage.

The luminance reduction with a high raised duty is due to a very high luminescence response speed of the organic thin-film EL element in comparison with the imposed pulse thereon. This is because the organic thin-film EL element has no memory nature in the luminescence mechanism. To have a matrix type organic thin-film EL panel with a plenty of scan lines luminesce under a stable voltage and with a high luminance, it accordingly is necessary to have a devised drive circuit such that a stable voltage is kept imposed on an associated organic thin-film EL element over a sufficient length of time, i.e., it is needed to provide an organic thin-film EL element combined with a drive circuit adapted to have its own memory nature.

A drive circuit so adapted is reported in the EURODISPLAY '90, a collection book of prepared papers published by the Society for Information Display, at pages 216 to 219. FIG. 2 is a circuit diagram of a number of organic thin-film EL elements employed as current-controlled luminescent elements in a luminous element array reported in this collection book, while for the convenience of description no more than a portion of two rows crossing over two columns is shown in the figure.

As shown in FIG. 2, the luminous element array has, among a matrix of unit pixels or picture elements, an arbitrarily taken one 130 at a place where an (N+1)-th element row intersects an M-th element column, that comprises a luminescent element EL (an organic thin-film EL element) of a current-controlled type of which the luminance is controlled in dependence on the current conducted therethrough, a current-controlling transistor $Q_I$, for controlling the current of the luminescent element EL, a charge holding capacitor C, and a switching tansistor $Q_S$. To permit selecting an arbitrary one of the picture elements in the array, a scan electrode line is provided for each row, and a signal electrode line for each column. For example, in FIG. 2, the picture element 130 disposed at the intersection of the (N+1)-th row with the M-th column is selectable by concurrently selecting a scan electrode line $103_{N+1}$ common to a plurality of picture elements constituting the (N+1)-th row and a signal electrode line $101_M$ common to a plurality of picture elements constituting the M-th column. The luminescent element EL is given a power supply voltage $V_{DD}$ via a power source electrode line 105 for elements in the same row.

When in FIG. 2 the scan electrode line $103_{N+1}$ is selected, the switching transistor $Q_S$ is turned on. Then, a voltage on the signal electrode line $101_M$ is imposed via the switching transistor $Q_S$ on the charge holding capacitor C. Following this condition, if the scan electrode line $103_{N+1}$ enters a non-selected state, the switching transistor $Q_S$ turns off and the capacitor C holds the imposed voltage thereacross. The capacitor C then has its terminal voltage applied between a gate and a source of the current-controlling transistor $Q_I$ so that, depending on a drain current vs. gate voltage characteristic of the transistor $Q_I$, a current is conducted from the power supply electrode line 105 through the luminescent element EL and the transistor $Q_I$ to a common electrode line 106, making the luminescent element EL luminesce. It therefore is possible to make the luminescent element EL luminesce with a preset luminance determined from a relationship between the luminance of the element EL and the imposed voltage on the capacitor C. Moreover, the applied voltage between the gate and the source of the current-controlling transistor $Q_I$ is maintained by a quantity of stored charges in the capacitor C, at a substantially constant voltage for a predetermined time period. In the luminous element array in concern in which the drive circuit of each luminescent element exhibits such a memory nature as described, even if a drive pulse is imposed with a narrowed pulse duration for a high raised duty, the luminance of the luminescent element EL is prevented from lowering according thereto. It is unnecessary for the prevention of luminance reduction to raise the supplied voltage ($V_{DD}$ from the power source electrode line 105 in this case) to the luminescent element EL.

The luminous element array shown in FIG. 2 has the capacity C provided for the gate of the current-controlling transistor $Q_I$. The capacitor C may be replaced by a parasitic or barrier capacitance between the gate and the source of the transistor $Q_I$ in consideration of circuit conditions such as a charge holding time.

The luminance-stabilized luminous element array, in which the picture elements are arranged in a matrix form, is yet disadvantageous in that the image quality is subject to deteriorations due mainly to broken, disconnected or short-circuited wiring lines. In general, the frequency of occurrence of such accidents increases as the line length or the number of line-on-line intersections increases. In the luminous element array shown in FIG. 2, it is needed for driving the picture element 130 to provide four types of common lines. i.e. the signal electrode line $101_M$, the scan electrode line $103_{N+1}$, the power source electrode line 105 and the common electrode line 106. As a result, there appear as many as four intersections denoted by a o mark within a region of the single picture element 130 shown in FIG. 2. As will be seen from this case, the number of common lines constitutes an essential factor in the art: if increased even by a smallest number, it will invite a significant increase in both total length of lines and total number of line-on-line intersections, thus resulting in an increased probability of occurrences of line breakage, disconnection and short circuit, causing the non-defective unit productivity to be reduced.

SUMMARY OF THE INVENTION

It is therefore an object of the present invention to provide a current-controlled luminous element array of a high quality active matrix type having a significantly reduced tendency to image quality deteriorations due to common line breakage, disconnection and short circuit, and a method for producing the same.

To achieve the object, the present invention provides a current-controlled luminous element array in which a plurality of combinations of a luminous element of a current-controlled type provided with a pair of terminals, a current-controlling transistor for controlling the current of the luminous element, and a switching transistor are arranged in the form of a matrix between a plurality of signal electrode lines and a plurality of scan electrode lines such that the luminous element is connected at either terminal thereof to a power source electrode line and at the other terminal thereof to a drain electrode of the current-controlling transistor and that a gate electrode of the current-controlling transistor and one signal electrode line have the switching transistor connected therebetween, wherein the current-controlling transistor in an arbitrary one of a plurality of columns of the matrix has a source electrode thereof connected to one scan electrode line in another column.

Preferably, the drain electrode of the current-controlling transistor and the gate electrode thereof have a charge holding capacity connected therebetween, and more preferably, the luminous element has a diode installed in a current conducting route thereof and oriented in the forward direction thereof.

Moreover, the luminous element may preferably comprise a charge injection type organic thin-film EL element including at least one organic luminescent layer, and/or the current-controlling transistor may preferably comprise an amorphous silicon thin-film transistor of a reversely staggered type.

Further, it may provide a preferable effect that said another column be the previous one to the arbitrary one in the order of the columns.

According to the present invention, a current-controlled luminous element array has a current-controlling transistor in an arbitarary column of matrix-like arranged picture elements, connected at a source electrode thereof to a scan electrode line in another column, thereby eliminating a common electrode line that otherwise would be needed in each column. The elimination of wiring lines, even though the smallest in number of lines per column, permits a significant reduction in total line length and in number of intersections between lines in different layers of luminous element array, which effectively lowers the probability of occurences of line breakage, disconnection and short circuit and improves the image quality of display.

Moreover, according to an aspect of the invention, a diode is provided in such a direction that conducts a current in the forward direction of a luminous element. Therefore, even when a reverse voltage from a scan electrode line in a selected column is imposed across the luminous element in a non-selected column, no current is conducted through the luminous element, which is thus protected against undesired current and prevented from deteriration.

Still more, to achieve the object, the present invention provides a method for producing a current-controlled luminous element array consisting of a plurality of thin-filmed picture elements arrayed in the form of a matrix having rows and columns, the picture elements each respectively having formed therein a corresponding part of a signal electrode line common to the picture elements in the same row, a corresponding part of a scan electrode line common to the picture elements in the same column, a corresponding part of a power source electrode line common to the picture elements in the same column, a current-controlling transistor provided with a source electrode, a gate electrode and a drain electrode, a switching transistor provided in an interconnecting circuit between the corresponding part of the signal electrode line and the gate electrode of the current-controlling transistor, and a luminous element controlled with a conducted current from the corresponding part of the power source electrode line to the drain electrode of the current-controlling transistor, comprising the steps of connecting the source electrode of the current-controlling transistor in the picture element in concern to the scan electrode line common to the picture elements in an arbitrary column other than the same column, and connecting the luminous element in the picture element in concern, at one terminal thereof, to the corresponding part of the power source electrode line in the same picture element and, at the other terminal thereof, to the drain electrode of the current-controlling transistor in the same picture element.

When applied to a matrix type organic thin-film EL display, the present invention permits the number of picture elements to be significantly increased to have a high-quality vision with a low voltage and a high luminance.

BRIEF DESCRIPTION OF THE DRAWINGS

The objects, features and advantages of the present invention will become more apparent from consideration of the following detailed description, taken in conjunction with the accompanying drawings, in which.

DESCRIPTION OF THE PREFERRED EMBODIMENTS

There will be detailed below preferred embodiments of the present invention, with reference to FIGS. 3 to 6. The embodiments, both the first and the second, have employed a pair of reversely staggered a-SiTFT(amorphous silicon thin-film transistor)'s as a switching transistor and a current-controlling transistor, in combination with an organic thin-film EL element as a luminescent luminous element, as later described.

Figure 1:
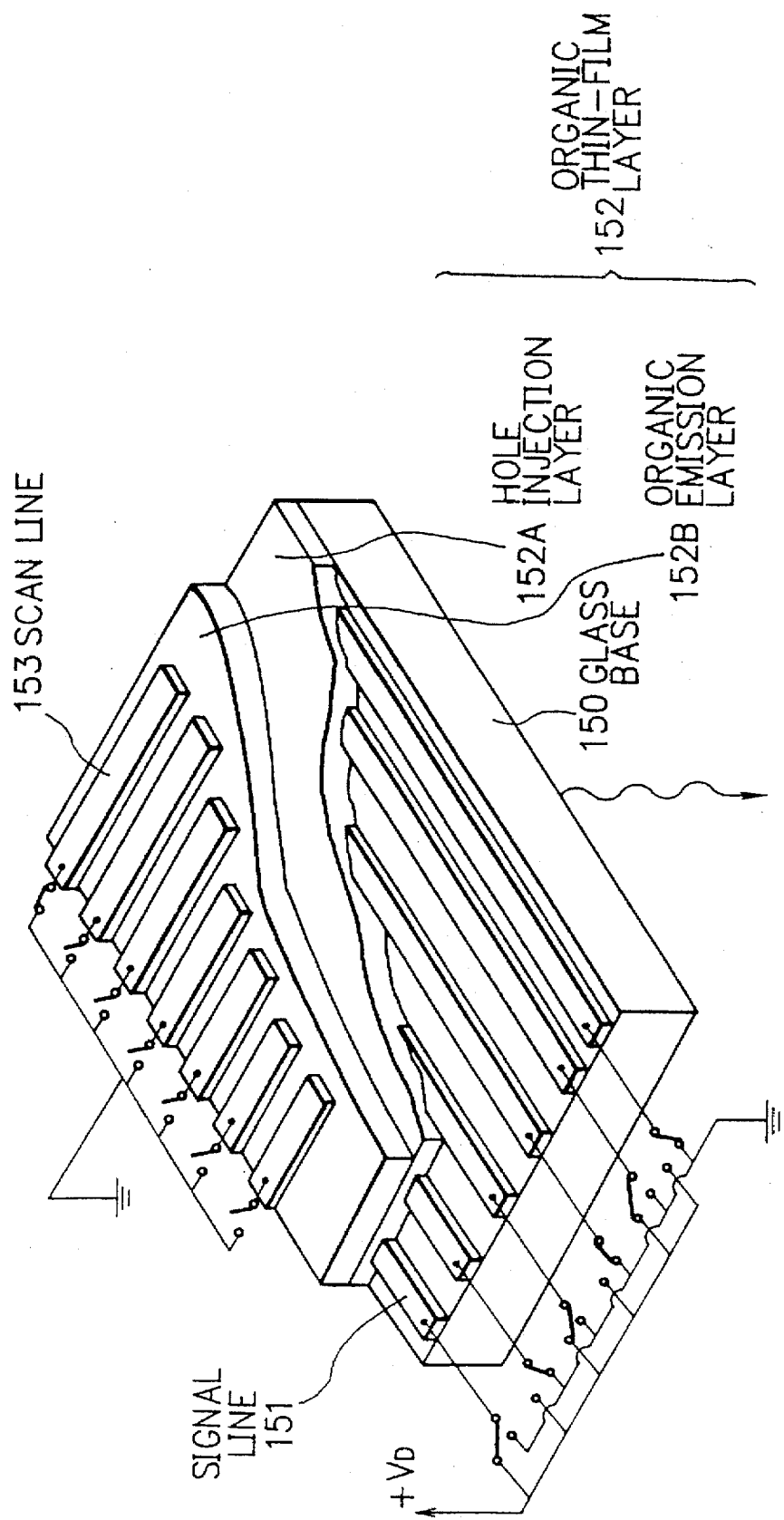
FIG. 1 is a perspective sectional view of a conventional simple matrix type display panel using an organic thin-film EL element.
Figure 2:
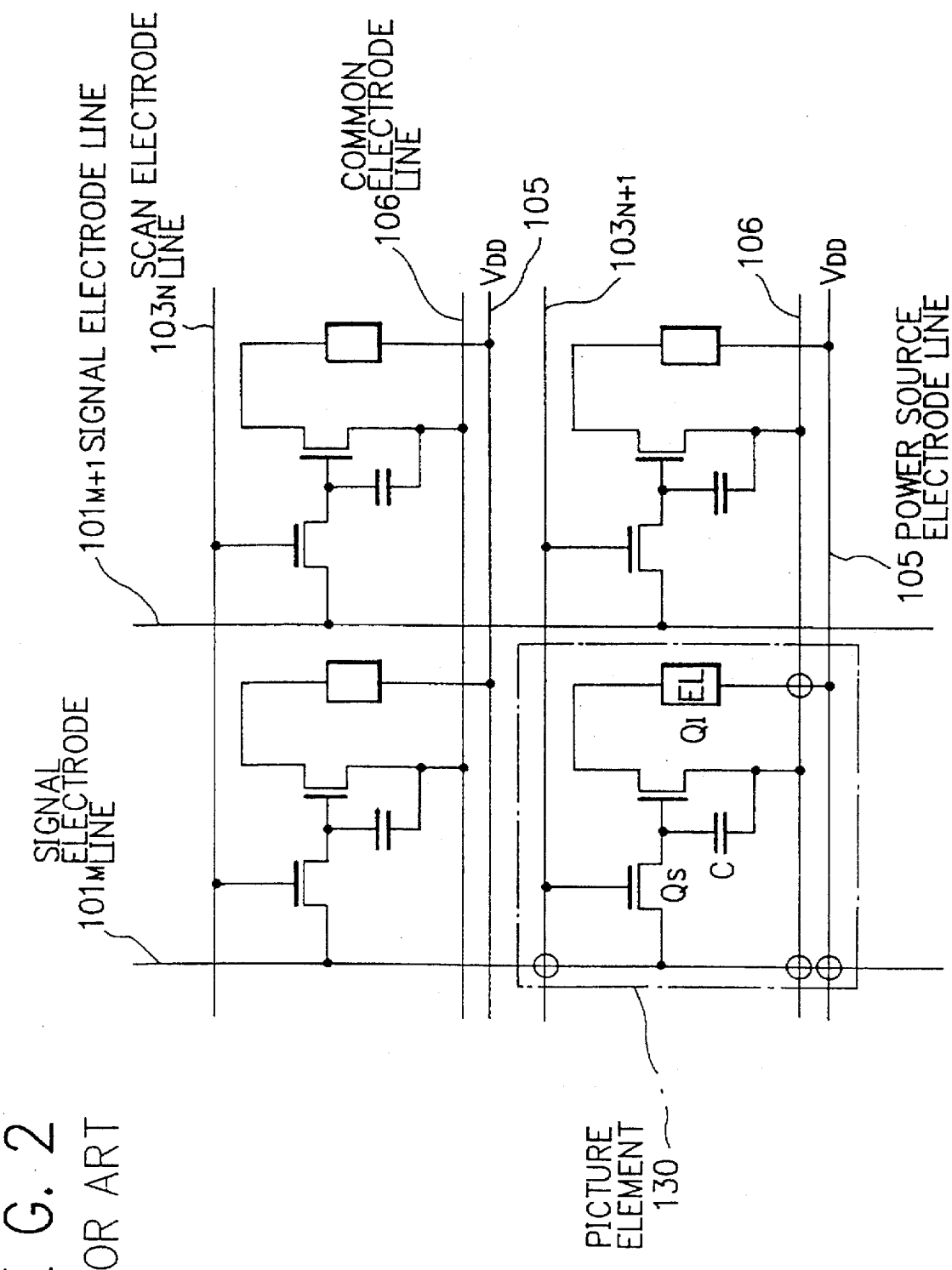
FIG. 2 is a partial circuit diagram of a conventional current-controlled luminous element array.
Figure 3:
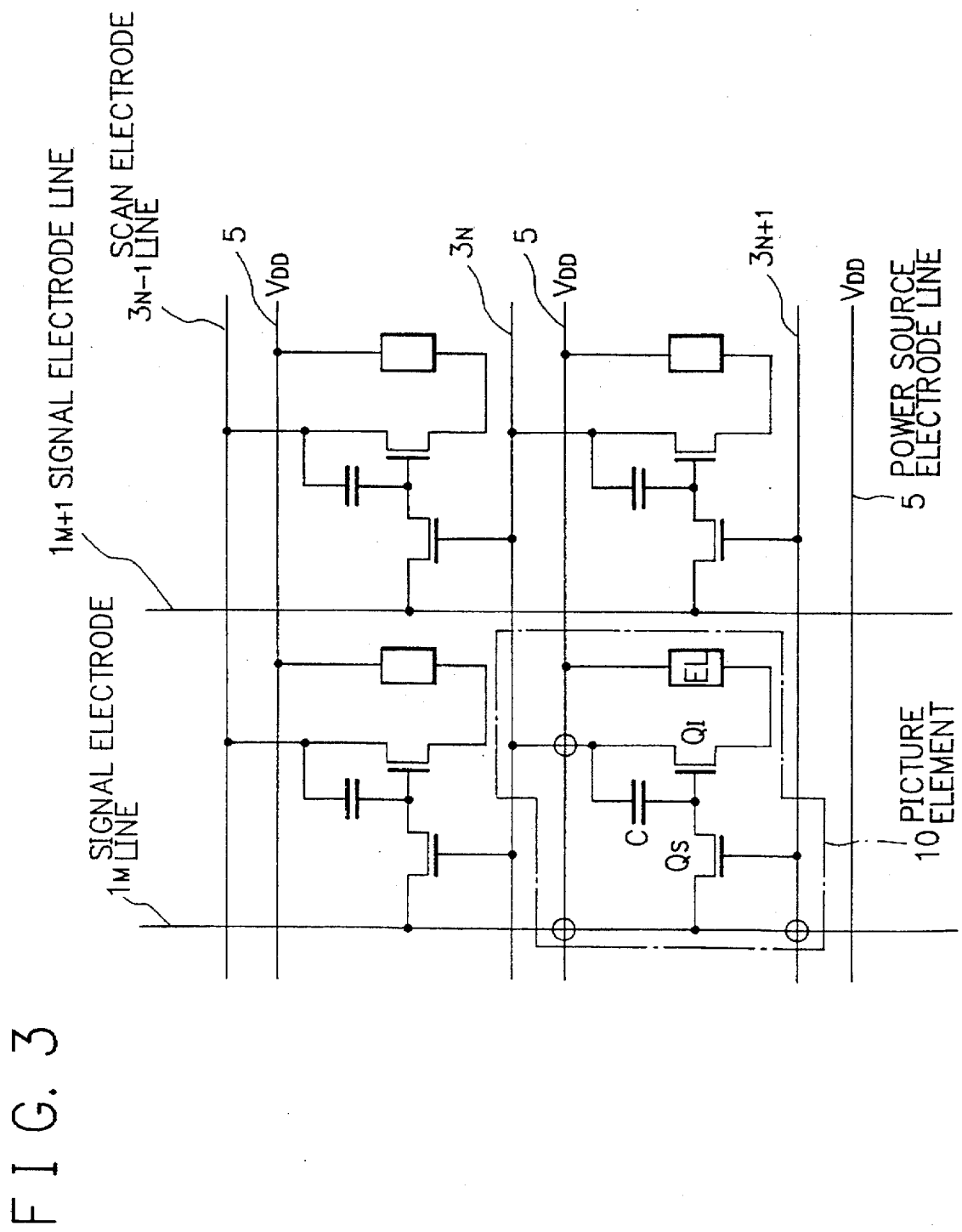
FIG. 3 is a partial circuit diagram of a current-controlled luminous element array according to a first embodiment of the invention.

The first embodiment will be described first in respect of the circuitry. FIG. 3 is a partial circuit diagram of a luminous element array according to the first embodiment, showing a portion of two rows crossing over two columns in the array, like FIG. 2 showing a conventional example. The first embodiment is different from the conventional example in that, in the shown circuitry in FIG. 3, a current-controlling transistor $Q_I$ in a picture element 10 in one row has a source electrode thereof, i.e. an electrode thereof at the opposite end to another connected to a luminescent element EL, connected to a scan electrode line $3_N$ in an adjacent previous row, and a charge holding capacitor C in the same picture element 10 has one electrode thereof, i.e. one of two electrodes thereof at the opposite end to the other connected to a gate electrode of the transistor $Q_I$, connected to the same scan electrode line $3_N$. In other words, in the first embodiment, exemplarily in the case of the picture element 10 disposed in an (N+1)-th row, at an M-th column, the above-mentioned electrodes of the transistor $Q_I$ and the capacitor C are both connected to the scan electrode line $3_N$ in the adjacent previous row (N-th row), like respective cases of other picture elements in the array. whereas in the case of the example of FIG. 2 the conventional luminous element array has corresponding electrodes in each picture element, both connected to the common electrode line 106.

Figure 4:
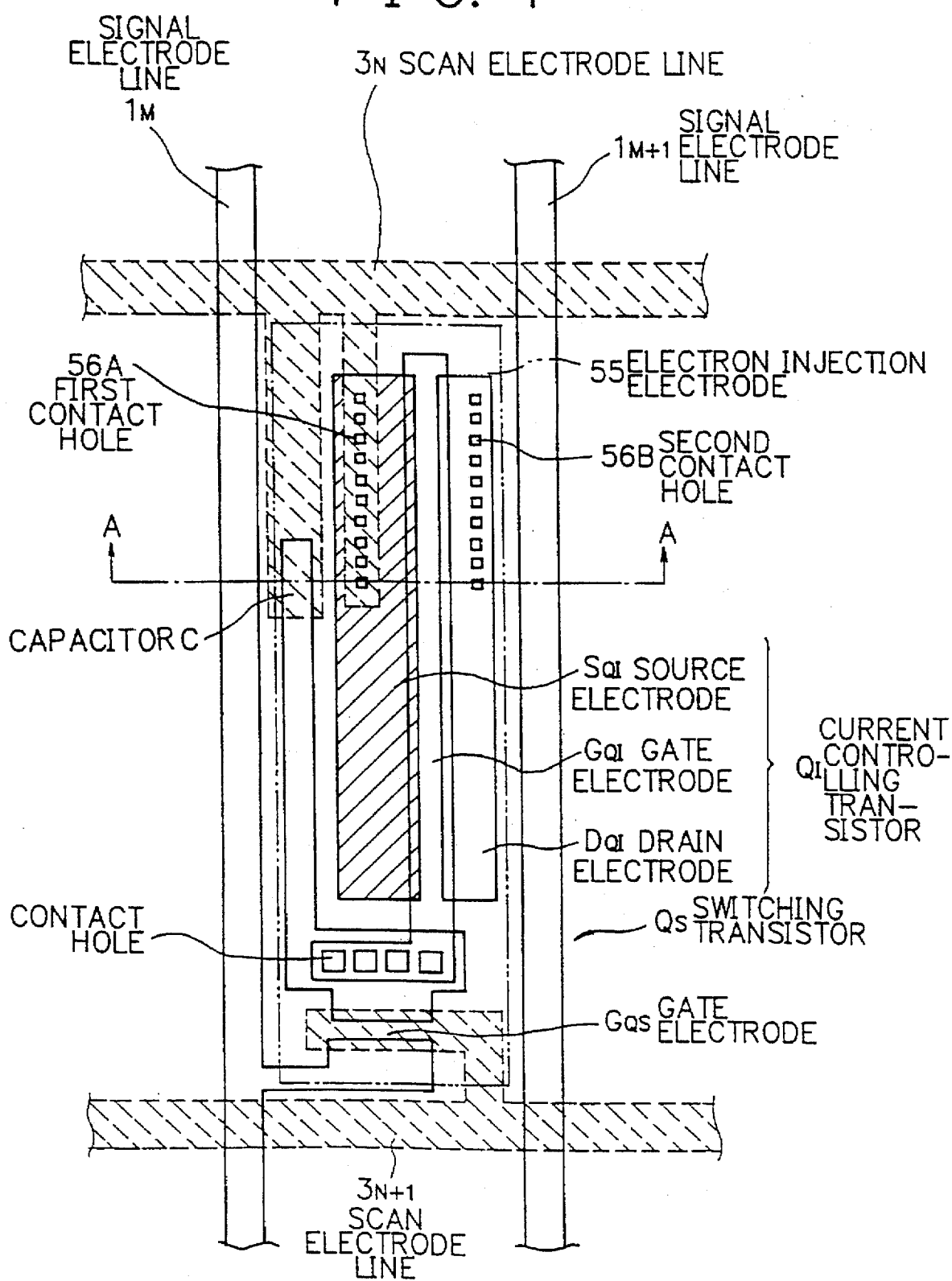
FIG. 4 is a partial plan view of the internal structure of a picture element in the first embodiment.
Figure 5:
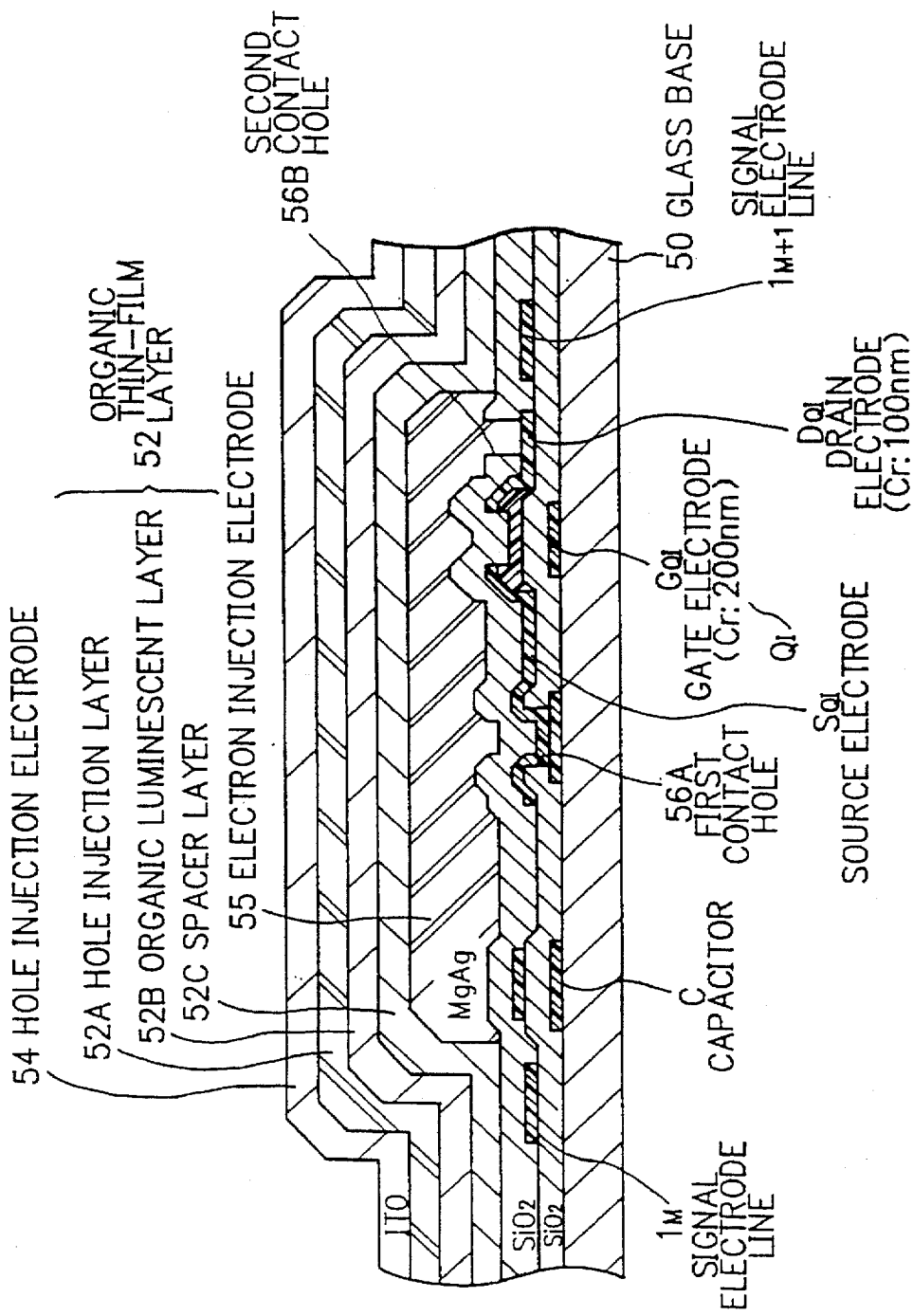
FIG. 5 is a sectional view along line A—A of FIG. 4.

The first embodiment will be further described with respect to the plan layout, sectional structure, etc. FIG. 4 is a partial plan view mapping the layout of component elements in a square region of the picture element 10 shown in FIG. 3. That is, the lay out of the charge holding capacitor C, the current-controlling transistor $Q_I$ and a switching transistor $Q_S$ disposed in a four-sided picture element region enclosed with scan electrode lines $3_N$ and $3_{N+1}$ and signal electrode lines $1_M$ and $1_{M+}$, in FIG. 3. The luminescent element EL as a layered organic thin-film EL element extends over the capacitor C and the transistors $Q_I$ and $Q_S$, covering substantially the entirety of the picture element region, and is deleted from FIG. 4 to avoid a complicated drawing, except a later-described electron injection electrode 55. FIG. 5 is a sectional view along line A—A of FIG. 4, showing a detailed layer structure in a profile including the charge holding capacitor C and the current-controlling transistor $Q_I$ as well as the organic thin-film EL element formed over them.

Referring now to FIG. 5, each picture element has employed a pair of reversely staggered a-SiTFT's (the transistors $Q_I$, $Q_S$) in combination with an organic thin-film EL element. The EL element includes an organic thin-film layer 52 of a three-layered structure having a spacer layer 52C, an organic luminescent layer 52B and a hole injection layer 52A laminated in this order over a glass base 50, on the a-SiTFT type current-controlling transistor $Q_I$ in FIG. 5. The spacer layer 52C is provided to prevent excitons from dissociating along the boundary surfaces of electrodes. On the organic thin-film layer 52 is formed a transparent hole injection electrode 54 using the transparent electrode material ITO, which electrode 54 corresponds to a power source electrode line 5 shown in FIG. 3. Formed under the organic thin-film layer 52, i.e. on the side of a-SiTFT's, is the electron injection electrode 55 consisting of a metallic material MgAg. This electrode 55 is connected through second contacts in second contact holes 56B to a drain electrode $Q_{QI}$ of the current-controlling transistor $Q_I$. Among the described thin-film layers of the organic thin-film EL element, the electron injection electrode 55 is patterned like an independent iland in each picture element region, while the organic thin-film layer 52 and the hole injection electrode 54 are made common to the whole picture elements of the luminous element array, i.e. formed over the entire region of a display panel. In the panel, when an arbitrary picture element is selected to be driven, there develops an electric field acting thereon, causing the organic luminescent layer 52B to luminesce, externally emitting flux of light through the transparent electrode 54.

In the picture element in concern, as shown by a hatching in FIG. 4, from the scan electrode line $3_N$, extending in the N-th row of the array a straight branch is extended perpendicularly thereto, to thereby constitute a lower electrode of the charge holding capacitor C, and another branch from the same line $3_N$ is connected through first contacts in first contact holes 56A to the source electrode $S_{QI}$ of the current-controlling transistor $Q_I$. Thus, one electrode of the capacitor C in this picture element disposed in the (N+1)-th row and the source electrode of the transistor $Q_I$ in the same picture element are both connected to the scan electrode line $3_N$ in the N-th row, i.e. an adjacent previous row in the order of rows. For the switching transistor $Q_S$ in this picture element, the scan electrode line $3_{N+1}$ extending in the (N+1)-th row of the array provides a straight branch that constitutes a gate electrode $G_{QS}$ of the transistor $Q_S$. Thus, the gate electrode $G_{QS}$ of the transistor $Q_S$ in this picture element disposed in the (N+1)-th row is connected to the scan electrode line $3_{N+1}$ in the same row.

There will be described a method for producing the luminous element array according to the first embodiment, substantially in a limitted manner to the shown profile in FIG. 5.

First, on the glass base 50 is grown a Cr layer 200 nm thick. Then, a patterining process is executed for the scan electrode lines $3_N$ and $3_{N+1}$, the lower electrode of the charge holding capacity C, the gate electrode $G_{QS}$ of the switching transistor $Q_S$ and the gate electrode $G_{QI}$ of the current-controlling transistor $Q_I$. An SiO$_2$ layer is let to grow 400 nm to provide a gate insulation, before an etching to open the first contact holes 56A.

Thereafter, an i-a-Si (intrinsic amorphous silicon) layer is let to grow 300 nm on the SiO$_2$ and an n$^+$-a-Si (n$^+$ amorphous silicon) layer for ohmic contact use is let to grow 50 nm. The grown layers are concurrently pattern-processed to define small islands of a-SiTFT. The islands will have channels formed therein for the transistors $Q_I$ and $Q_S$ in a later process.

Then, a Cr layer 100 nm thick is deposited and pattern-processed to provide the signal electrode line $1_M$, the source electrode $S_{QI}$ and the drain electrode $D_{QI}$ of the current-controlling transistor $Q_I$, a drain electrode and a source electrode of the switching transisitor $Q_S$, an upper electrode of the charge holding capacitor C and the first contacts. The channels of the transistors $Q_I$ and $Q_S$ are then formed by etching the a-SiTFT islands consisting of the i-a-Si layer covered with the n$^+$-a-Si layer, into an intermediate depth of the i-a-S layer, using the pattern-processed Cr layer as a mask.

Then, a SiO$_2$ layer is let grow 200 nm, before an etching to open the second contact holes 56B for intercommunication between the source electrode $S_{QI}$ of the current-controlling transistor $Q_I$ and the electron injection electrode 55 to be formed as a lower electrode of the organic thin-film EL element in the subsequent process.

Then, an MgAg layer is let to grow 200 nm and processed by a lift-off method for a patterning to form the electron injection electrode 55. By the procedures described, there is produced a panel member having 400×640 picture element regions of a size of 100×300 µm$^2$/element.

Then, on the panel member is formed the organic thin-film layer 52 of the organic thin-film EL element. The organic thin-film layer 52 has a three-layered structure consisting of the spacer layer 52C for preventing the dissociation of excitons along the boundary surafces of electrodes, the organic luminescent layer 52B and the hole injection layer 52A, laminated in this sequence on the electron injection electrode 55, as described. To form the spacer layer 52C, vaporized tris-(8-hydroxynolin) aluminium is vacuum deposited 50 nm. Thereafter, tris-(8-hydroxynolin) aluminium and 3,9-perylene dicarbonyl acid diphenyl ester from different vacuum vapor sources are codeposited 70 nm to form the organic luminescent layer 52B. Then, 1,1-bis-(4-N,N-ditolyl aminophenyl) cyclohexane vapor is deposited 50 nm to form the hole injection layer 52A.

As a final process, the hole injection electrode 54 is formed as a layer 1 µm thick, by coating the organic thin-film layer 52 with the transparent electrode material ITO.

The first embodiment will be still described, with respect to the action. In FIG. 3, if the scan electrode line $3_{N+1}$ is selected, the switching transistor $Q_S$ is turned on. The signal electrode line $1_M$ in the M-th column then has a line voltage thereof imposed via the switching transistor $Q_S$ on the charge holding capacitor C.

Thereafter, the scan electrode line $3_{N+1}$ enters a non-selected state. The switching transistor $Q_S$ then turns off, and the charge holding capacitor C holds thereacross the imposed voltage from the signal electrode line $1_M$. The capacitor C thus has its terminal voltage applied between the gate and source electrodes of the current-controlling transistor $Q_I$ so that, according to a drain current vs. gate voltage characteristic of the transistor $Q_I$, an electric current runs through an established conducting route: the power source electrode line 5→the luminescent element EL→the transistor $Q_I$→the scan electrode line causing the luminescent element EL to luminesce. The luminance of the luminescent element EL is controllable at a preset level, by using a relationship thereof to the imposed voltage on the capacitor C.

An experiment of the first embodiment was made. The organic thin-film EL element exhibited a luminance of approx. 200 cd/m$^2$ with a drive voltage of 7 V applied thereacross, while the current density therein was approx. 0.8 mA/cm$^2$. The total power consumption in the organic thin-film EL elements of the whole picture elements in the panel was 1.84 W, and the efficiency, 7.81 lm/W. It therefore is confirmed that the first embodiment has greater performances than conventional luminescent type displays.

In addition to such low power consumption and high luminance natures in comparison with conventional luminescent type displays, the first embodiment needs no more than three common lines per picture element: the signal electrode line 1, the scan electrode line 3 and the power source electrode line 5, and does not require the provision of conventional common electrode line 106 in FIG. 2. As a result, the total line length is reduced to be smaller than approximately two thirds of a conventional value. The number of line-on-line intersections per picture element also is reduced to as small as three as shown by o mark in FIG. 3, which conventionally has been needed to be four or larger, as seen from FIG. 2.

In the first embodiment, the current-controlling transistor $Q_I$ disposed in an arbitrary row (e.g. (N+1)-th row in FIG. 3) of matrix-addressed picture elements has the source electrode thereof connected to the scan electrode line 3 in the adjacent previous row (e.g. N-th row in FIG. 3). This connection is not limited to the shown example. In the active matrix type luminous element array, the row selection is performed by seqentially selecting a corresponding one of row-addressed scan electrode lines. Therefore, the source electrode of each current-controlling transistor $Q_I$ may be advantageously connected to an arbitrary one of the scan electrode lines, but one (e.g. line $3_{N+1}$ in FIG. 3) that lies in the same row (e.g. (N+1)-th row in FIG. 3) as the current-controlling transistor $Q_I$ in concern.

Moreover, in the first emobdiment, the organic thin-film layer 52 having a three-layered structure may preferably be replaced with a single organic thin-film luminescent layer. Further, any layered film to constitute the organic thin-film layer may preferably comprise a uniform film consisting of a single material or a hybrid film having mixed a polymer or resin. Still more, the hole injection electrode 54 may be made by using an ordinary material in the art, subject to a sufficient transparency or translucency. The transparent electrode material ITO may thus be replaced by $SnO_2$, $SnO_2$: Sb, ZnO:Al or Au, etc. The electron injection electrode material MgAg also may be replaced by Al, In, Mg, Ag, Mg:In, Al:Li, etc.

Figure 6:
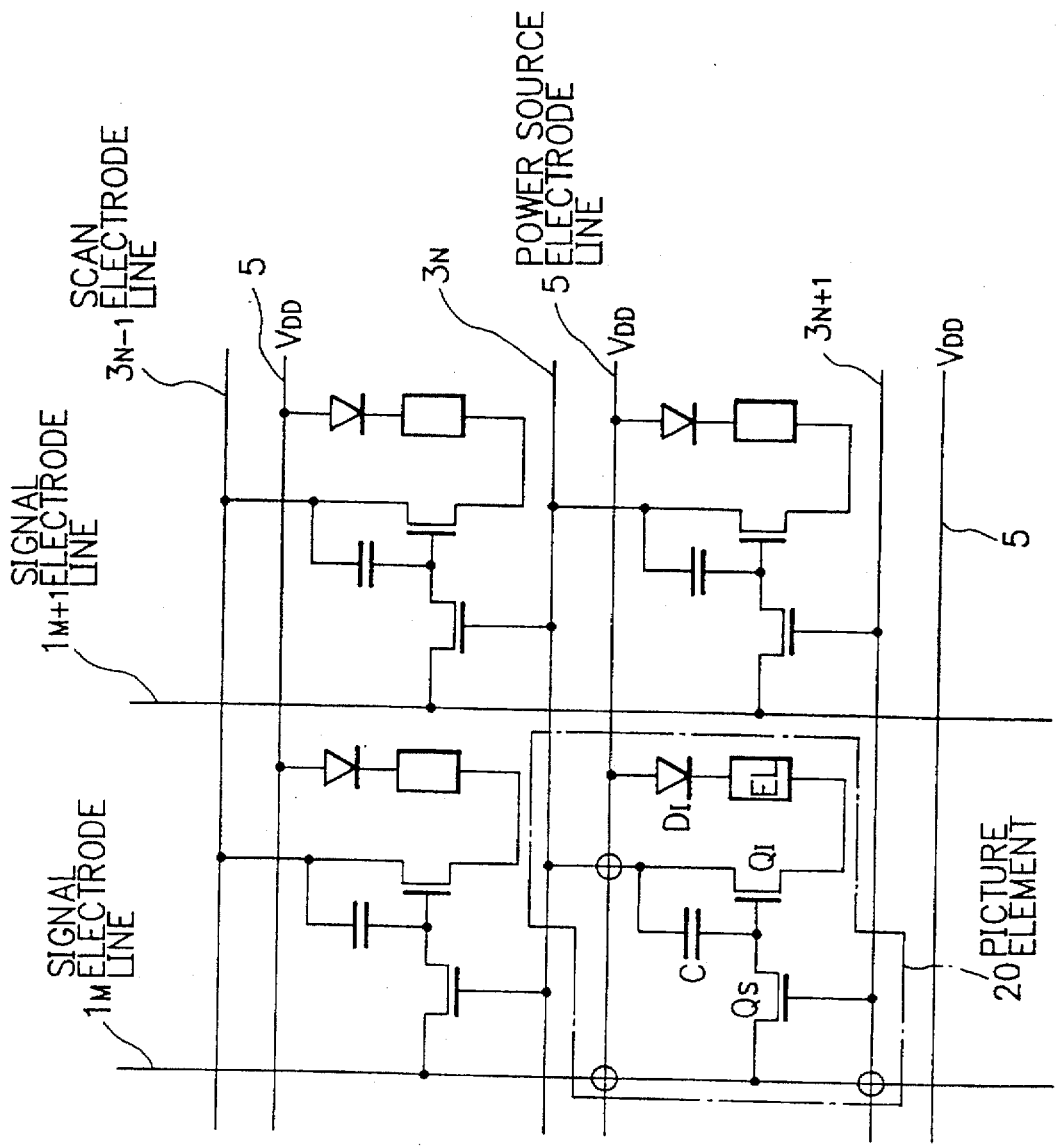
FIG. 6 is a partial circuit diagram of a current-controlled luminous element array according to a second embodiment of the invention.

The second embodiment will be described. FIG. 6 is a partial circuit diagram of a current-controlled luminous element array according to the second embodiment. As will be seen by comparison of FIG. 6 to FIG. 3, the second embodiment is different from the first in that, between from a power source electrode line 5 to a luminescent element EL, a forward diode $D_I$ is connected in series.

In FIG. 6, if a scan electrode line $3_{N+1}$ is selected and hence a switching transistor $Q_S$ is turned on, a signal electrode line $1_M$ has a line voltage thereof imposed via the switching transistor $Q_S$ on a charge holding capacitor C. Thereafter, the scan electrode line $3_{N+1}$ enters a non-selected state. Then, the switching transistor $Q_S$ turns off, and the charge holding capacitor C holds thereacross the imposed voltage from the signal electrode line $1_M$. The capacitor C thus has its terminal voltage applied between gate and source electrodes of a current-controlling transistor $Q_I$ so that an electric current runs through an established conducting route: the power source electrode line 5→the diode $D_1$→the luminescent element EL→the transistor $Q_I$→a scan electrode line $3_N$, causing the luminescent element EL to luminesce. The luminance of the luminescent element EL is controllable at a preset level, by using a relationship thereof to the imposed voltage on the capacitor C, like the first embodiment.

Circuit conditions are now supposed in FIG. 6 such that the scan electrode line $3_{N+1}$ has, when it is selected, a higher voltage and, while non-selected, a lower voltage than the line voltage $V_{DD}$ Of the power source electrode line 5 and that the luminescent element EL luminesces when a current is conducted in the direction from the diode $D_I$, to the current-controlling transistor $Q_I$. Under such the conditions, when the scan electrode line $3_N$ lying in the N-th row is selected, if the diode $D_I$ is not inserted, a reverse voltage would be applied across the luminescent element EL connected to the scan electrode line $3_N$, causing the element EL to be degraded in performance or broken. In the second embodiment, however, for the luminescent element EL in each picture element 20 the diode $D_I$ is provided in the direction that permits an easy conduction of current from the power source electrode line 5 to the scan electrode line $3_N$, and hence when the scan electrode line $3_N$ is selcted, a reverse voltage is imposed across the diode $D_I$ in the picture element 20 addressed (N+1)-th row, M-th column in FIG. 6. However, the diode $D_I$ then functions as an absorber of the imposed reverse voltage on the luminescent element EL due to a voltage difference between the line voltage of the scan electrode line $3_N$ and the line voltage $V_{DD}$ of the power source electrode line 5, thus preventing a current from being conducted through the element EL, thereby effectively protecting the element EL.

Also in the second embodiment, the current-controlling transistor $Q_I$ disposed in an arbitrary row (e.g. (N+1)-th row in FIG. 6) of matrix-addressed picture elements has the source electrode thereof connected to the scan electrode line in the adjacent previous row (e.g. N-th row in FIG. 6). This connection is not limited to the shown example. The source electrode of each current-controlling transistor $Q_I$ may be advantageously connected to an arbitrary one of the scan electrode lines, but one (e.g. line $3_{N+1}$ in FIG. 6) that lies in the same row (e.g. (N+1)-th row in FIG. 6) as the current-controlling transistor $Q_I$ in concern.

The second embodiment has employed as a current-controlled luminous element the organic thin-film EL element of the first embodiment. The luminous element however is not limited to this. It may be of any type that gives a variable luminance depending on a conducted current, e.g. an EL or LED.

Further, in both the first and the second embodiments, the matrix-addressed arrangement of picture elements may preferably be modified by changing the row and columns for each other.

While the present invention has been described with reference to the particular illustrative embodiments, it is not to be restricted by those embodiments but only by the appended claims. It is to be appreciated that those skilled in the art can change or modify the embodiments without departing from the scope and spirit of the present invention.

What is claimed is:

1. A current-controlled luminous element array, comprising:

a plurality of current-controlled-type luminous elements, each luminous element comprising a pair of terminals and at least one organic luminescent layer;

a current-controlling transistor for controlling a current through said luminous element;

a switching transistor, wherein said luminous element, said current-controlling transistor, and said switching transistor are arranged in a matrix between a plurality of signal electrode lines and a plurality of scan electrode lines; and a diode connected to each of said luminous elements and oriented in a forward direction toward each of said luminous elements, wherein said luminous element is connected at a first of said pair of terminals to a power source electrode line through said diode and at the other one of said pair of terminals to a drain electrode of said current-controlling transistor, and wherein a gate electrode of said current-controlling transistor and one of said signal electrode lines have said switching transistor connected therebetween, and wherein said current-controlling transistor in an arbitrary one of a plurality of columns of said matrix has a source electrode thereof connected to one of said scan electrode lines in another one of said columns.

2. A current-controlled luminous element array as claimed in claim 1, wherein:

said source electrode of said current-controlling transistor and said gate electrode thereof have a charge holding capacitor connected therebetween.

3. A current-controlled luminous element array as claimed in claim 1, wherein said another one of said columns comprises a previous one to said arbitrary one of said columns.

4. A plurality of picture elements for a luminescent display arranged in an array of rows and columns, each of said picture elements comprising:

a power supply line;

a scan electrode line positioned along a row;

a signal electrode line positioned along a column;

a charge injection-type organic thin-film electroluminescent element including at least one organic luminescent layer connected in series between a diode and a current-controlling transistor, said electroluminescent element having a first electrode connected to said power supply line through said diode and a second electrode connected to a drain of said current-controlling transistor, said current-controlling transistor having a source connected to said scan electrode line of an adjacent picture element in a same row; and a switching transistor connected between said signal electrode line and a gate of said current-controlling transistor, said switching transistor having a gate connected to said scan electrode line for turning on and off said current controlling transistor thus allowing a current to flow through said electroluminescent element.

5. A plurality of picture elements for a luminescent display as recited in claim 4 wherein any one of said power supply line, said scan electrode line, and said signal electrode line physically cross over top another one of said power supply line, said scan electrode line, and said signal electrode line in a picture element a maximum of three times.

6. A plurality of picture elements for a luminescent display as recited in claim 4 further comprising a capacitor connected between said current-controlling transistor gate and source.

7. A plurality of picture elements for a luminescent display as recited in claim 4 wherein said diode is forward biased.

8. A plurality of picture elements for a luminescent display as recited in claim 4 wherein said electroluminescent element comprises:

a hole injection layer, an organic luminescent layer, and a spacer layer, sandwiched between said first electrode and said second electrode.

9. A plurality of picture elements for a display arranged in an array of rows and columns, each of said picture elements comprising:

a power supply line;

a scan electrode line positioned along a row;

a signal electrode line positioned along a column;

an electroluminescent element connected in series between a diode and a current-controlling transistor, said electroluminescent element having a first electrode connected to said power supply line through said diode and a second electrode connected to a drain of said current-controlling transistor, said current-controlling transistor having a source connected to said scan electrode line of an adjacent picture element in a same row; and a switching transistor connected between said signal electrode line and a gate of said current-controlling transistor, said switching transistor having a gate connected to said scan electrode line for turning on and off said current-controlling transistor thus allowing a current to flow through said electroluminescent element.

10. A plurality of picture elements for a display as recited in claim 9 wherein said electroluminescent element comprises a charge injection-type thin-film electroluminescent element.

11. A plurality of picture elements for a display as recited in claim 10 wherein said charge injection-type thin-film electroluminescent element includes at least one organic luminescent layer.

12. A plurality of picture elements for a display as recited in claim 9 wherein anyone of said power supply line, said scan electrode line, and said signal electrode line physically cross over top another one of said power supply line, said scan electrode line, and said signal electrode line in a picture element a maximum of three times.

13. A plurality of picture elements for a display as recited in claim 9 further comprising a capacitor connected between said current-controlling transistor gate and source.

14. A plurality of picture elements for a display as recited in claim 9 wherein said diode is forward-biased.

* * * * *